United States Patent [19]

Schmit

[11] Patent Number: 5,170,376
[45] Date of Patent: Dec. 8, 1992

[54] ASYNCHRONOUS TIMING CIRCUIT FOR A 2-COORDINATE MEMORY

[75] Inventor: Jean-Jacques Schmit, Brussels, Belgium

[73] Assignee: Alcatel N.V., Amsterdam, Netherlands

[21] Appl. No.: 573,205

[22] PCT Filed: Dec. 24, 1988

[86] PCT No.: PCT/EP88/01215
  § 371 Date: Aug. 13, 1990
  § 102(e) Date: Aug. 13, 1990

[87] PCT Pub. No.: WO90/07777
  PCT Pub. Date: Jul. 12, 1990

[51] Int. Cl.⁵ .............................................. G11C 7/00
[52] U.S. Cl. ................................... 365/233; 365/203
[58] Field of Search ............... 365/203, 233, 230.06

[56] References Cited

U.S. PATENT DOCUMENTS 4,712,197 12/1987 Sood ................................. 365/203
4,918,657 4/1990 Takahashi ......................... 365/203

FOREIGN PATENT DOCUMENTS 0190823 8/1986 European Pat. Off. .
0240156 10/1987 European Pat. Off. .
0262995 4/1988 European Pat. Off. .

OTHER PUBLICATIONS

Patent Abstracts of Japan, vol. 11, No. 203 (P-591) (2650), 2 Jul. 1987.
IEEE Journal of Solid-State Circuits, vol. 23, No. 5, Oct. 1988, D. T. Wong et al.: "An 11-NS 8K×18 CMOS Static RAM with 0.5-Mum Devices".

Primary Examiner—Joseph A. Popek
Attorney, Agent, or Firm—Ware, Fressola, Van Der Sluys & Adolphson

[57] ABSTRACT

An asynchronous timing or control circuit (TIM) for a RAM memory applies a row selection (ROWD) signal to one end (WIO/WIN) of a selected memory row (WORDO/WORDN) and a corresponding control signal (WOO/WON) is collected at the other end (WOO/WON) of this row through a common NOR gate (04) with an input for each row. Since this control signal reflects the propagation time of a signal through the row, it is used to control the precharging (PRECHB) of the memory columns prior to any subsequent read or write operation, the latter using the same row selection signal.

14 Claims, 4 Drawing Sheets

ASYNCHRONOUS TIMING CIRCUIT FOR A 2-COORDINATE MEMORY

BACKGROUND OF THE INVENTION

1. Field of the Invention

The present invention relates to a control circuit for a 2-coordinate memory wherein an input signal is propagated through a memory row in order to derive a control signal for read or write operations.

2. Description of the Prior Art

Such a control circuit is already known in the art, e.g. from the article entittled "An 11-ns 8K×18 CMOS Static RAM with 0.5-um Devices" by D. T. WONG et al, published in the IEEE JOURNAL OF SOLID-STATE CIRCUITS, VOL. 23, NO. 5, October 1988 pages 1095 to 1103. Therein, the input signal is applied to one end of a reference row or word-line of the memory and the control signal is collected at the other end of this reference word-line. Since the reference word-line closely tracks the propagation time of a signal through an actual row or word-line of the memory, the control signal is used to restore a word-line selection signal within the active part of a read or write operation. This system has the advantage of automatically adapting the duration of a read or write operation to the length of the rows of the memory. However, to this end, the memory must be provided with a reference word-line whereby the propagation time of a signal through an actual word-line is simulated and the input signal must be applied to this reference word-line simultaneously with the application of a word-line selection signal to any word-line of the memory.

SUMMARY OF THE INVENTION

An object of the present invention is to provide a control circuit of the above known type but which does not require any reference word-line in the memory while keeping the above mentioned advantage.

According to the invention, this object is achieved due to the fact that said control circuit includes row selection means to apply said input signal to a desired row and coupling means to provide said control signal from any of said rows.

By applying the input signal to one end of the desired row or word-line of the memory, by collecting the signals at the other ends of all the word-lines and by coupling them with the coupling means one obtains the above control signal without using any reference word-line. In this way, apart from no reference word-line being required, the control signal reflects the actual propagation time of a signal through the desired row or word-line and is thus no longer a mere simulation thereof.

Another characteristic feature of the present invention is that said row selection means are used for selecting a row of said memory and in that said input signal is a row selection signal.

Since the above input signal is also the row or word-line selection signal, i.e. the desired row is also the selected row, there is no need to provide means for applying simultaneously the input signal on the reference word-line and the word-line selection signal to another word-line of the memory. The control circuit is thereby simplified.

The data busses or columns of the memory associated to the above control circuit need to be precharged at a predetermined voltage prior to each read or write operation. In the known control circuit, at least two control signals, one for controlling the precharging of the columns and another for controlling the read or write operation itself, are required. Moreover, to avoid signal collisions, the delay between, e.g., the end of a read (or write) operation and the beginning of the precharging of the columns may for instance be given by a timer controlled by a clock signal. This delay is then generally chosen too long for security reasons.

Another object of the present invention is to provide a control circuit of the above known type but wherein the delay between the end of a read or write operation and the beginning of the precharging of the columns is optimized.

According to the invention, this other object is achieved due to the fact that said control signal is used for activating a precharge signal which controls the precharging of the columns of said memory to a predetermined voltage level prior to a subsequent read or write operation.

In this way, any signal collision is avoided and the above delay is dynamically adapted to the length of the word-lines of the memory associated to the control circuit and may thus be optimized. Furthermore, the number of control signals may be reduced since the precharging of the columns is controlled by the word-line selection signal.

DESCRIPTION OF THE DRAWINGS

The above mentioned and other objects and features of the invention will become more apparent and the invention itself will be best understood by referring to the following description of an embodiment taken in conjunction with the accompanying drawings wherein.

DETAILED DESCRIPTION OF THE PREFERRED EMBODIMENT

Figure 1:
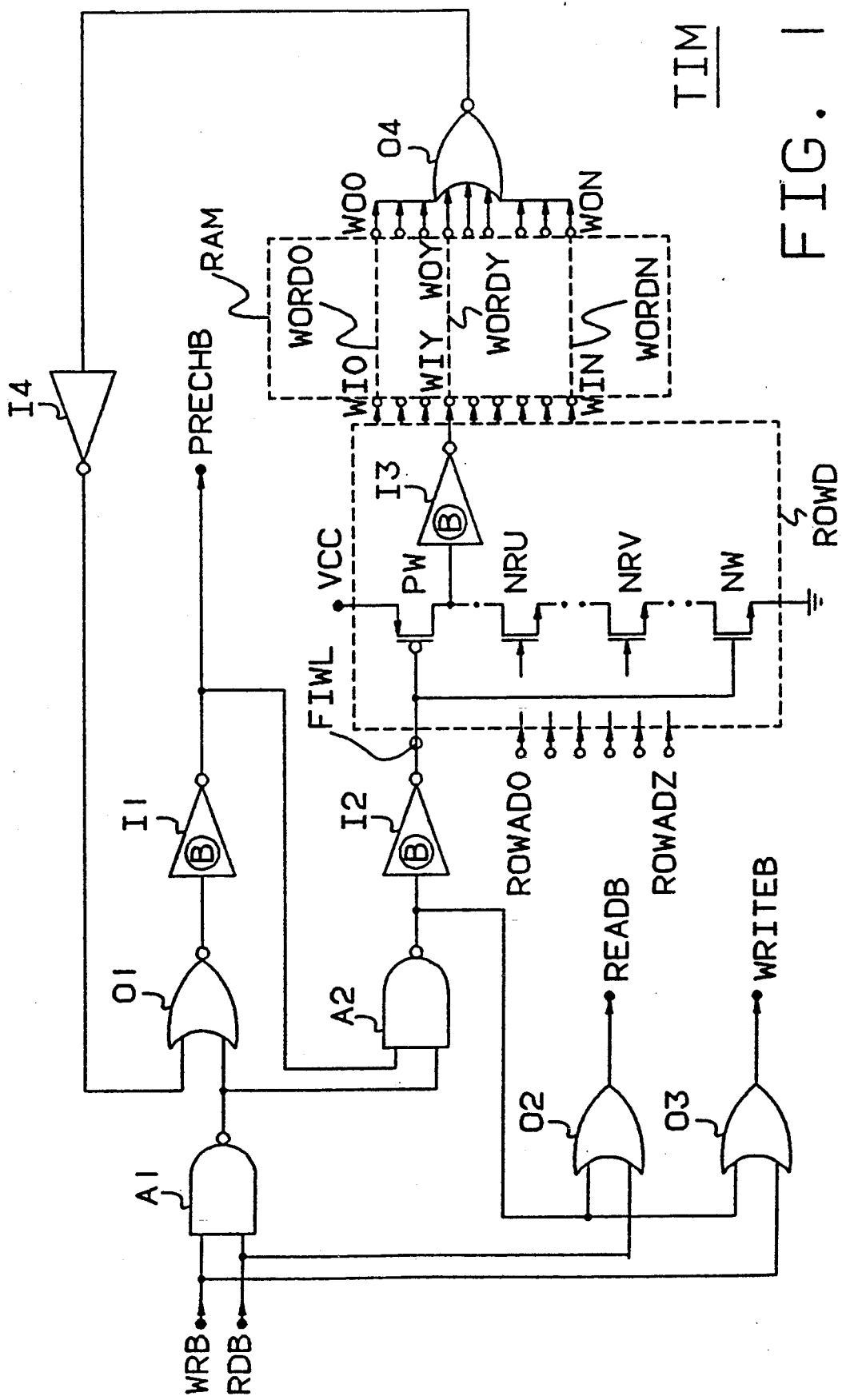
FIG. 1 shows an asynchronous timing circuit TIM for generating control signals for a RAM memory and which is realized according to the invention.

The asynchronous timing or control circuit TIM represented in FIG. 1 is used to produce and to schedule control signals for addressing a static Random Access Memory RAM in order to read words of data bits therefrom or to write words of data bits therein. Both the control circuit TIM and the memory RAM are integrated in a same electronic chip which also includes a row address decoder ROWD described later. The read or write operation on the memory RAM occurs under control of a single read RDB or write WRB request signal applied to the like-named input terminal of TIM respectively.

Figure 2:
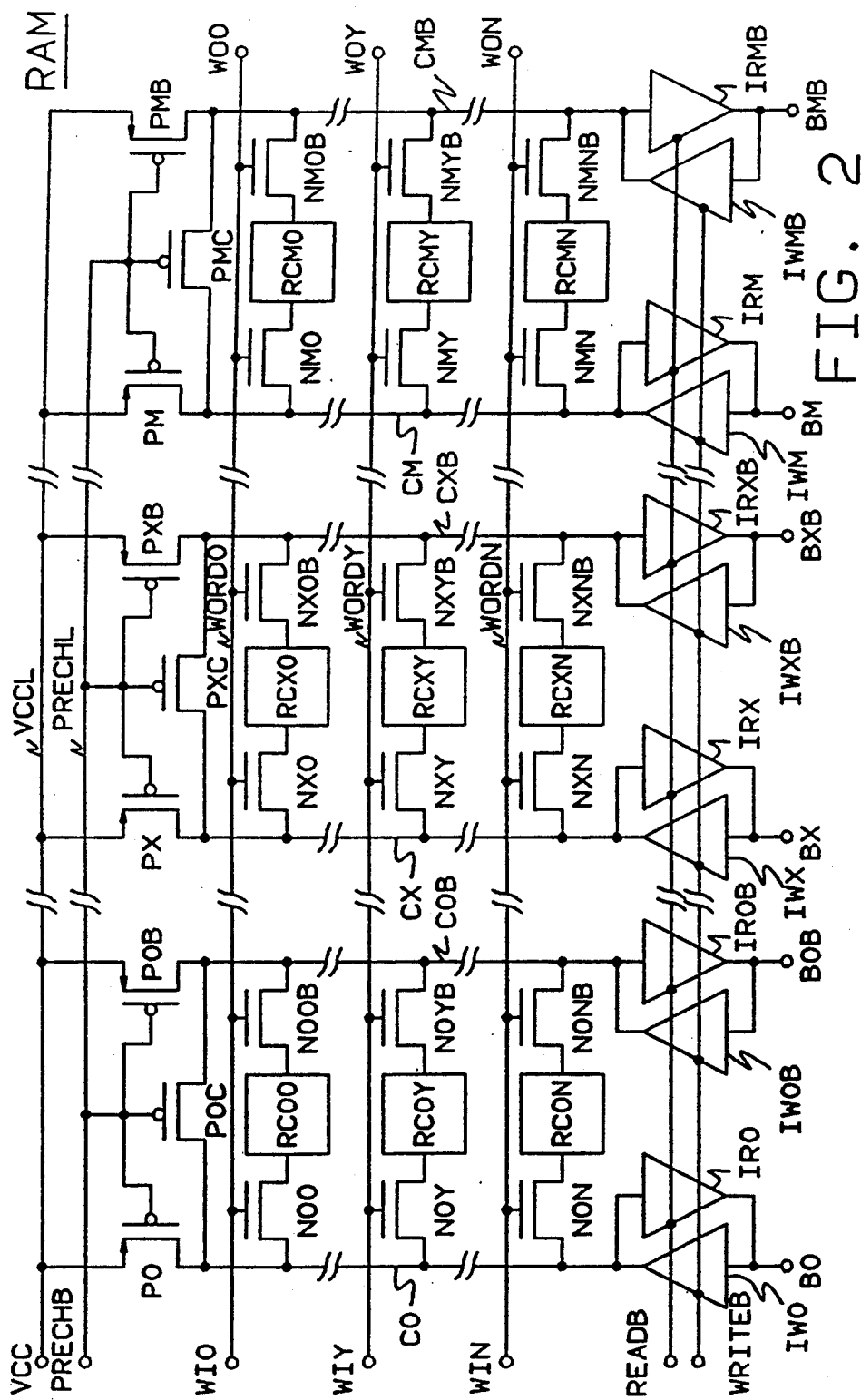
FIG. 2 shows a portion of the RAM memory using the asynchronous timing circuit TIM of FIG. 1.

The memory RAM controlled by the circuit TIM is a matrix of memory cells, defined by their row (Y) and column (X) coordinates, of which some RCOO . . . RCXO . . . RCMO . . . RCOY . . . RCXY . . . RCMY . . . RCON . . . RCXN . . . RCMN are represented in FIG. 2 and which are each able to store one bit of data. The RAM has rows also called word-lines such as WORD0, . . . , WORDY, . . . , WORDN carrying like-named signals and of which each end is connected to a word-line terminal WIO/WOO, . . . , WIY/WOY, ..., WIN/WON respectively. Each word-line of the RAM comprises a number of memory cells equal to the number of data bits constituting the word to be read from or written into the RAM. Each column RCXO . . . RCXY . . . RCXN of the memory RAM includes, connected to its memory cells, two bit busses (columns) CX and CXB of which one is able to carry a data bit and the other to carry its complement. The memory cells RCXO . . . RCXY . . . RCXN are each connected to the bit bus CX/CXB via the main path of a NMOS transistor NXO/NXOB . . . NXY/NXYB . . . NXN/NXNB of which the gate is connected to the corresponding word-line WORDO . . . WORDY . . . WORDN respectively. The bottom end of the bit bus CX/CXB is connected to a data terminal BX/BXB via bidirectional tristate buffers represented by parallel connected read IRX/IRXB and write IWX/IWXB gates respectively. More generally, the bottom ends of the bit busses CO/COB to CM/CMB are connected to data terminals BO/BOB to BM/BMB via parallel connected read gates IRO/IROB to IRM/IRMB and write gates IWO/IWOB to IWM/IWMB respectively. All the read gates are controlled via a common read control terminal READB to which a like-named read control signal is applied by the asynchronous timing circuit TIM, whilst all the write gates are controlled via a common write control terminal WRITEB to which a like-named write control signal is applied by this same circuit TIM.

It is to be noted that the source electrode of the NMOS transistors NXO/NXOB . . . NXY/NXYB . . . NXN/NXNB is not indicated in FIG. 2 by an arrow as usual. This is due to the fact that these NMOS transistors as well as the NMOS transistors NOO/NOOB . . . NOY/NOYB . . . NON/NONB and NMO/NMOB . . . NMY/NMYB . . . NMN/NMNB connecting the memory cells RCOO . . . RCOY . . . RCON and RCMO . . . RCMY . . . RCMN to the bit busses CO/COB and CM/CMB respectively can operate in two directions, i.e. transmit a data bit from the corresponding memory cell to the connected bit bus or from this bit bus to the memory cell. Moreover, according to standard definitions used for RAM devices, a memory cell is "charged" when a logical one (1) is written therein and that its old value was a logical zero (0), whilst a memory cell is "discharged" when a logical zero (0) is written therein and that its old value was a logical one (1). Similarly, a bit bus can also be "charged" or "discharged" as will be described below.

A voltage supply VCC of +5 Volts is applied to the RAM via a voltage supply line (row) VCCL connected to a voltage supply terminal VCC. More particularly, the voltage supply line VCCL is connected to the top ends of the bit busses CO/COB . . . CX/CXB . . . CM/CMB via the source to drain paths of PMOS transistors PO/POB . . . PX/PXB . . . PM/PMB respectively, the drain electrodes of the transistors PO . . . PX . . . PM being interconnected with those of the transistors POB . . . PXB . . . PMB respectively via the main path of respective PMOS transistors POC . . . PXC . . . PMC. All these PMOS transistors have their gate electrode connected to a precharge line (row) PRECHL of the matrix and are thus commonly controlled by a so-called "precharge" signal PRECHB supplied on this line PRECHL by terminal PRECHB thereof.

It is to be noted that all the memory cells RCOY . . . RCXY . . . RCMY of a same word-line WORDY and corresponding thus to a full word of data bits are simultaneously selected in order to read or write a full word of data at a time. To this end, only one word-line signal WORDY is set high by the asynchronous timing circuit TIM and applied to the terminal WIY as a like-named input signal. This signal WORDY propagates then over the word-line WORDY until the terminal WOY where it appears as a like-named control signal. As a result, all the NMOS transistors NOY/NOYB . . . NXY/NXYB . . . NMY/NMYB connected to the memory cells RCOY . . . RCXY . . . RCMY respectively of the word-line WORDY are conductive so that there is a connection between each of these memory cells and its associated bit busses CO/COB . . . CX/CXB . . . CM/CMB respectively. The data bits of the word may thus be written into or read from all the M memory cells of the word-line WORDY via the terminals BO/BOB to BM/BMB.

In such a static RAM memory, the precharge signal PRECHB is used to apply the supply voltage VCC, which corresponds to a logical one (1), to all the bit busses CO/COB to CM/CMB prior to read data from or to write data into any memory cell RCOO . . . RCXO . . . RCMO to RCON . . . RCXN . . . RCMN. More in detail, when a logical one (1) has for instance to be written into a memory cell RCXY, the precharge signal (1) already available on the bit busses CX has only to be "transferred" to this memory cell, whilst the bit bus CXB is first "discharged" to zero volts (ground), e.g., via an NMOS transistor included in the write gate IWXB. This happens under the control of the data bits 1 and 0 applied on the data terminals BX and BXB respectively by an external device (not shown). The precharge signal PRECHB is active low which means that the transistors PO/POB/POC to PM/PMB/PMC are all conductive during the precharge operation. Obviously, the precharge signal PRECHB must be set inactive, i.e. high, immediately before one word-line WORDO . . . WORDY . . . WORDN is selected.

A purpose of the asynchronous timing circuit TIM is to keep the precharge signal PRECHB inactive as long as a word-line WORDY of the RAM is selected, and this without knowing the length of the word of data bits, i.e. of the number of memory cells constituting a word-line of the memory RAM.

To this end, and referring again to FIG. 1, the asynchronous timing circuit TIM is constituted as follows.

The asynchronous timing circuit TIM which is connected between the voltage supply terminal VCC and the ground has input terminals:

WRB and RDB to which external like-named input signals may be applied to respectively request for a write or for a read operation of the static RAM memory, the input signals WRB and RDB are active low;

ROWADO to ROWADZ to which a binary word constituted by Z+1 bits and indicating the address (number) of the word-line WORDY to be selected in the RAM is applied; and WOO to WON which are connected to the like-named word-line control terminals of the RAM respectively.

The output terminals of the asynchronous timing circuit TIM are:

PRECHB which is connected to the like-named precharge terminal of the RAM and at which the like-named precharge signal is supplied;

READB and WRITEB which are connected to the respective like-named read and write control terminals of the RAM and of which the signals provided thereat control the bidirectional tristate buffers IRO/IROB and IWO/IWOB to IRM/IRMB and IWM/IWMB respectively; and WIO to WIN which are connected to the like-named word-line input terminals of the RAM respectively.

The input terminals WRB and RDB are connected to a first and to a second inputs of a NAND gate A1 respectively of which the output is connected to both a first input of a NOR gate O1 and a first input of a second NAND gate A2. The output of the NOR gate O1 is connected to the terminal PRECHB via an inverting buffer I1 whilst this terminal PRECHB is connected to a second input of the NAND gate A2. The output of the NAND gate A2 is connected to first inputs of two OR gates O2 and O3 respectively. The terminal RDB is connected to a second input of the OR gate O2 of which the output is connected to the read control terminal READB whilst the terminal WRB is connected to a second input of the OR gate O3 of which the output is connected to the write control terminal WRITEB. The output of the NAND gate A2 is further connected, via a second inverting buffer I2, to a control terminal FIWL of the row address decoder ROWD partially represented in FIG. 1.

The row address decoder ROWD has the input terminals ROWAD0 to ROWADZ and the output terminals WIO to WIN. The circuit of ROWD allowing the selection of a word-line WORDY connected to the output terminal WIY is only partially shown in FIG. 1. For this selection, ROWD includes, between the supply voltage terminal VCC and the ground, the series connection of the source to drain path of a PMOS transistor PW, the drain to source paths of Z+1 NMOS transistors such as NRU and NRV and the drain to source path of a NMOS transistor NW. The gates of the transistors PW and NW are commonly connected to the control terminal FIWL at which a like-name line control signal appears whilst the gate of each transistor NRU/NRV is connected (not shown) to a distinct input terminal ROWAD0 ... ROWADZ either directly or via an inverter according to the binary address of the word-line to be selected. The junction point between the drains of the transistors PW and the first transistor of the series NRU/NRV is connected to the output terminal WIY via an inverting buffer I3.

The input terminals WOO to WON are connected to respective inputs of a NOR gate O4 of which the output is connected to a second input of the NOR gate O1 via an inverter I4.

Figure 4:
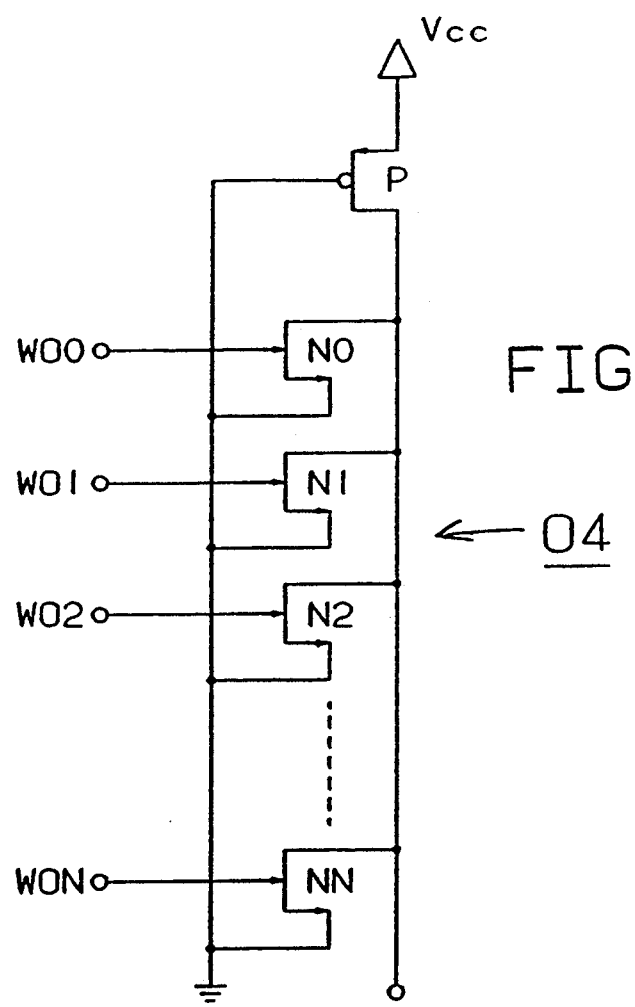
FIG. 4 shows a circuit design of logical NOR gate 04.

It is to be noted that, in order to reduce the volume occupied by a classical NOR gate on an electronic chip, the NOR gate O4 only comprises N+1 NMOS transistors (not shown) connected in parallel, i.e. with their source and drain electrodes respectively interconnected, and one PMOS (not shown) transistor showing a high drain-to-source impedance. As shown in FIG. 4, each control terminal WOO to WON of the memory RAM is connected to the gate electrode of a distinct one of these NMOS transistors of which the commoned source electrodes are connected to both the gate electrode of the PMOS transistor and to the ground terminal, whilst the source electrode of the latter PMOS is connected to the voltage supply terminal VCC. The commoned drain electrodes of the NMOS transistors are connected to the drain electrode of the PMOS transistor and constitute the output of the NOR gate O4.

It is also to be noted that a signal applied as input to the inverter I4 immediately appears at the output thereof whilst a signal applied as input to any of the inverting buffers I1, I2 or I3 only appears at the output thereof after a delay which is function of the capacitive load connected to this output.

Figure 3:
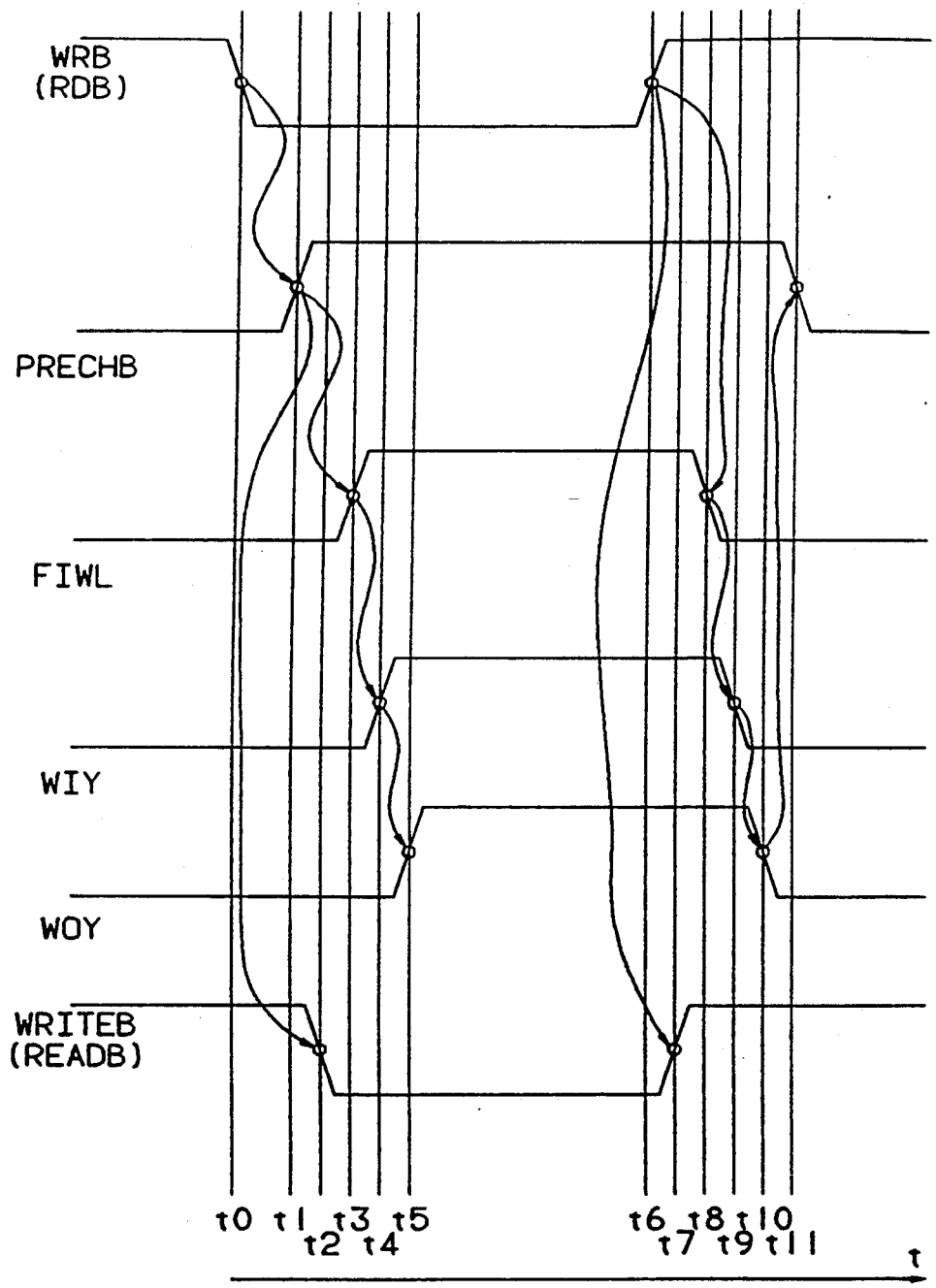
FIG. 3 shows various signals used in the asynchronous timing circuit TIM of FIG. 1.

The operation of the timing circuit TIM is described hereafter by making reference to the FIGS. 1, 2 and 3, the latter showing the signals WRB, PRECHB, FIWL, WIY, WOY and WRITEB. It is to be noted that in the following description only a write operation is considered. A read operation may be considered by using a similar reasoning and by replacing the signals WRB and WRITEB by RDB and READB respectively as indicated between brackets on the waveforms of FIG. 3.

Before a write operation starting at a moment t0 represented on the time axis t of FIG. 3, stable data bits are applied to the data terminals BO/BOB to BM/BMB and the input signal WRB is high (as well as RDB) so that the line control signal FIWL is low. No word-line WORD0 to WORDN is then selected since all the like-named signals WORD0 to WORDN (including WORDY) and thus also all the inputs signals WIO to WIN (including WIY) and all the control signals WOO to WON (including WOY) are low. The output signal of the NOR gate O4 is then high and the precharge signal PRECHB is low. As a result, the transistors PO/POB/POC to PM/PMB/PMC of the bit busses CO/COB to CM/CMB are conductive and these bit busses are in a precharge status. Also the signals WRITEB and READB are high thus inhibiting the connections between the terminals BO/BOB to BM/BMB at which the data bits of a word are applied and the corresponding bit busses CO/COB to CM/CMB.

At the beginning of the write operation, e.g. when the data bits of a word have to written into the word-line WORDY of the RAM, the request to write signal WRB is set to low while the binary address of this word-line WORDY is applied to the terminals ROWAD0 to ROWADZ.

As soon as the write signal WRB becomes active, i.e. low, at the moment t0, the precharge signal PRECHB goes to inactive, i.e. high, inhibiting thus the precharge of all the bit busses CO/COB to CM/CMB by blocking all the transistors PO/POB/POC to PM/PMB/PMC.

It is to be noted that the precharge signal PRECHB only becomes inactive, i.e. high, at a moment t1 occuring after the moment t0. This delay between t0 and t1 is due to the parasitic capacitance of the precharge line PRECHL in the memory RAM which prevents the output of the inverting buffer I1 to change immediately its status from low to high as mentioned above.

At a moment t2, which follows the moment t1, the signal WRITEB becomes low and the data bits of the word to be written into the memory cells are loaded onto the bit busses CO/COB to CM/CMB. It is to be noted that the delay between the moments t1 and t2 is short because it is only due to the parasitic capacitance of the memory line (row) to which the signal WRITEB is applied.

At a moment t3, also occuring after the moment t1, the line control signal FIWL becomes high. This delay between t1 and t3 is slightly larger than the delay between t1 and t2 because it is due to the parasitic capacitance at the control input FIWL of the circuit ROWD and to the operation of the inverting buffer I2 of the circuit TIM.

At a moment t4, occuring after the moment t3, the input signal WIY also becomes high and the memory cells RCOY ... RCXY ... RCMY associated to the word-line WORDY of which the address is applied to the inputs ROWAD0 to ROWADZ of ROWD are loaded with the data bits then available on the bit busses CO/COB to CM/CMB under the control of the word-line signal WORDY propagating over this word-line WORDY. The delay between the moments t3 and t4 is due to the parasitic capacitance of the word-line WORDY of the memory RAM and to the operation of the inverting buffer I3 of the circuit ROWD.

The propagation time of the signal WORDY over the like-named word-line from the terminal WIY (input signal WIY) to the terminal WOY (control signal WOY) is represented in FIG. 3 by the delay between the moments t4 and t5.

As long as the control signal WOY is high, i.e. from the moment t5, the precharge signal PRECHB remains inactive (high) because of the NOR gates 04 and 01 even if the input signal WRB is then reset.

At the end of the write operation, i.e. at a moment t6, the input signal WRB is reset, i.e. becomes high. As a consequence, the signals WRITEB and FIWL successively go low at respective moments t7 and t8 thus inhibiting the access of the data bits at the data terminals BO/BOB to BM/BMB to the corresponding bit busses CO/COB to CM/CMB and the selection of the word-line WORDY respectively.

Again because of the parasitic capacitances and the inverting buffers, the moment t8 occurs slightly later than the moment t7 and the input signal WIY only goes low at a moment t9 occuring after this moment t8.

Because of the propagation time of the input signal WIY over the word-line WORDY, the control signal WOY goes low at a moment t10 occuring after the moment t9.

From the moment t10, the signal at the output of the NOR gate 04 becomes high but the precharge signal PRECHB only goes active, i.e. low, at a moment t11 occuring after the moment t10 because of the parasitic capacitance of the line (row) PRECHL in the memory RAM.

As a result, the precharge signal PRECHB remains inactive at least as long as a word-line WORDY is selected.

While the principles of the invention have been described above in connection with specific apparatus, it is to be clearly understood that this description is made only be way of example and not as a limitation on the scope of the invention.

I claim:

1. Control circuit (TIM) for a 2-coordinate memory (RAM) wherein an input signal is propagated through a memory row (WORD0/WORDN) in order to derive a control signal for read or write operations,
   characterized in that said control circuit (TIM) includes row selection means (ROWD) to provide the input signal to a desired row of memory rows (WORD0/WORDN) and coupling means (04) to provide said control signal from any of said memory rows (WORD0/WORDN);
   wherein said row selection means (ROWD) selects a row (WORD0/WORDN) of said memory (RAM) by providing said input signal as a row selection signal;
   wherein said row selection signal is provided to a first end (WIO/WIN) of a memory row (WORD0/WORDN) and said coupling means (04) include a logical NOR gate (04) having inputs, each input connected to an opposite end (WOO/WON) of each of said memory rows (WORD0/WORDN), and having an output which provides said control signal.

2. Control circuit according to claim 1, characterized in that said control signal is used for activating a precharge signal (PRECHB) which controls the precharging of a column (CO to CMB) of said memory (RAM) to a predetermined voltage level prior to a subsequent read or write operation.

3. Control circuit according to claim 2, characterized in that said control circuit (TIM) is integrated in an electronic chip.

4. Control circuit according to claim 2, characterized in that the control circuit is provided with logical means (A1, A2, I1 to I3, 01 to 04) having a single memory access requesting terminal (RDB/WRB) as input for each of said read and write operations and which are able to control both said precharge signal (PRECHB) and the corresponding one of said read and write operations.

5. Control circuit according to claim 4, characterized in that said logical means (A1, A2, I1 to I3, 01 to 04) are able, upon activation of the signal applied to any of said inputs (RDB/WRB), to de-activate said precharge signal (PRECHB) prior to activate said input signal (WIO/WIN).

6. Control circuit according to claim 5, characterized in that said logical means (A1, A2, I1 to I3, 01 to 04) are able, after the de-activation said precharge signal (PRECHB), to allow data to be read from (READB) or written into (WRITEB) said columns (CO to CMB) of said memory (RAM).

7. Control circuit according to claim 5, characterized in that said logical means (A1, A2, I1 to I3, 01 to 04) are able, upon de-activation of the signal applied to any of said inputs (RDB/WRB), to de-activate said input signal (WIO/WIN) and to activate said precharge signal (PRECHB) upon detection of the subsequent de-activation of said control signal (WOO/WON).

8. Control circuit according to claim 4, characterized in that said logical means (A1, A2, I1 to I3, 01 to 04) are able, upon de-activation of the signal applied to any of said inputs (RDB/WRB), to prevent data to be read from (READB) or written into (WRITEB) said columns (CO to CMB) of said memory (RAM).

9. Control circuit according to claim 4, characterized in that said inputs (RDB/WRB) of said logical means (A1, A2 I1 to I3, 01 to 04) are the only inputs of said control circuit (TIM) which operates in an asynchronous way.

10. Control circuit according to claim 1, characterized in that said control circuit (TIM) is integrated in an electronic chip.

11. Control circuit according to claim 10, characterized in that said control circuit (TIM) and said memory (RAM) are integrated in the electronic chip.

12. Control circuit (TIM) for a 2-coordinate memory (RAM) wherein an input signal is propagated through a memory row in order to derive a control (WOO/WON) signal for read or write operations,
   characterized in that the control circuit (TIM) includes row selection means (ROWD) to provide the input signal to a desired row of memory rows (WORD0/WORDN) and coupling means (04) to provide the control signal from any of the memory rows (WORD0/WORDN);
   wherein said row selection means (ROWD) selects a row (WORD0/WORDN) of the memory (RAM)

by providing the input signal as a row selection signal;

wherein the row selection signal is provided to a first end (WIO/WIN) of a memory row (WORDO/WORDN) and the coupling means (04) include a logical NOR gate (04) having inputs, each input connected to an opposite end (WOO/WON) of each of the memory rows (WORDO/WORDN), and having an output which provides the control signal; and wherein said inputs of said NOR gate (04) include gate electrodes of NMOS transistors having commoned source electrodes connected to both a gate electrode of a PMOS transistor and to a first voltage supply terminal, and having commoned drain electrodes connected to a drain electrode of said PMOS transistor for providing an output of said NOR gate (04), and further having a source electrode of said PMOS transistor connected to a second voltage supply terminal (VCC).

13. Control circuit according to claim 12, characterized in that said control circuit (TIM) is integrated in an electronic chip.

14. Control circuit according to claim 13, characterized in that said control circuit (TIM) and said memory (RAM) are integrated in the electronic chip.

* * * * *